United States Patent
Röjder

(10) Patent No.: US 11,349,447 B2
(45) Date of Patent: May 31, 2022

(54) GENERATING HARMONICS IN AN AUDIO SYSTEM

(71) Applicant: DIRAC RESEARCH AB, Uppsala (SE)

(72) Inventor: Johannes Röjder, Uppsala (SE)

(73) Assignee: DIRAC RESEARCH AB, Uppsala (SE)

(*) Notice: Subject to any disclaimer, the term of this patent is extended or adjusted under 35 U.S.C. 154(b) by 0 days.

(21) Appl. No.: 17/292,351

(22) PCT Filed: Nov. 16, 2018

(86) PCT No.: PCT/SE2018/051190
§ 371 (c)(1),
(2) Date: May 7, 2021

(87) PCT Pub. No.: WO2020/101548
PCT Pub. Date: May 22, 2020

(65) Prior Publication Data
US 2022/0006436 A1 Jan. 6, 2022

(51) Int. Cl.
*H03G 3/30* (2006.01)
*H04R 3/04* (2006.01)

(52) U.S. Cl.
CPC ............. *H03G 3/3005* (2013.01); *H04R 3/04* (2013.01); *H04R 2430/01* (2013.01)

(58) Field of Classification Search
CPC ........ H03R 3/04; H03R 3/02; H03R 2430/01; H03G 3/3005; H03G 5/00; H03G 5/16
(Continued)

(56) References Cited

U.S. PATENT DOCUMENTS 6,111,960 A * 8/2000 Aarts ....................... H04R 3/00
  381/61
6,134,330 A * 10/2000 De Poortere ......... G10L 21/038
  381/61
(Continued)

FOREIGN PATENT DOCUMENTS

EP 1 915 027 4/2008
JP 2006-222867 8/2006

OTHER PUBLICATIONS

International Search Report for PCT/SE2018/051190 dated Aug. 20, 2019, 5 pages.
(Continued)

*Primary Examiner* — Xu Mei
(74) *Attorney, Agent, or Firm* — Nixon & Vanderhye

(57) ABSTRACT

A method and corresponding system for generating harmonics from an input signal having an input frequency uses a harmonics generator having an associated gain controller generating adjustable gain control factors, controlling the amplitude of harmonic components. The method includes generating a series of harmonic components in a process including adjustment of relative balances between at least three harmonic components of different orders, the balances being independently adjustable by controlling at least two gain control factors. Each gain control factor is adjusted based on a frequency dependent measure of the input signal or signal derived therefrom, of the frequency dependent measure of the input signal and/or derived signal unique for the corresponding gain control factor. An output signal is created including the harmonic components according to the balances as controlled by the at least two gain control factors, wherein the balances between the harmonic components depend on the input frequency.

27 Claims, 14 Drawing Sheets

(58) Field of Classification Search
USPC .................................................... 381/61, 98
See application file for complete search history.

(56) References Cited

U.S. PATENT DOCUMENTS

| | | | |
|---|---|---|---|
| 7,171,002 B2* | 1/2007 | Coats | H04S 1/002 |
| | | | 381/1 |
| 7,551,742 B2 | 6/2009 | Katou et al. | |
| 7,847,176 B2* | 12/2010 | Sugawara | G10H 1/16 |
| | | | 84/622 |
| 2007/0140511 A1 | 6/2007 | Lin et al. | |
| 2008/0170721 A1 | 7/2008 | Sun et al. | |
| 2010/0228368 A1* | 9/2010 | Oh | H04R 3/04 |
| | | | 700/94 |

OTHER PUBLICATIONS

Written Opinion of the ISA for PCT/SE2018/051190 dated Aug. 20, 2019, 7 pages.

\* cited by examiner

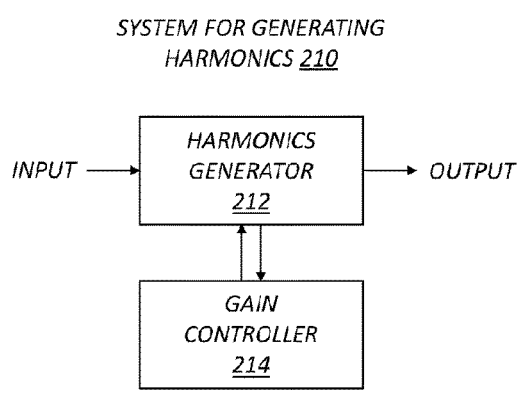
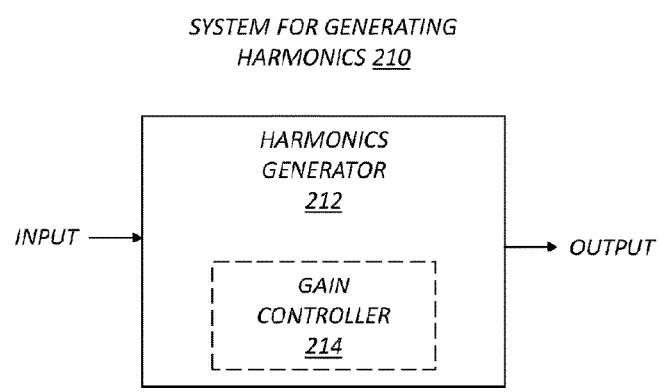
Fig. 2A
Fig. 2B

S1: GENERATING A SERIES OF HARMONICS IN A PROCESS COMPRISING ADJUSTMENT OF RELATIVE BALANCES BETWEEN AT LEAST THREE HARMONIC COMPONENTS OF DIFFERENT ORDERS, THE BALANCES BEING INDEPENDENTLY ADJUSTABLE BY CONTROLLING AT LEAST TWO GAIN CONTROL FACTORS

WHEREIN EACH PARTICULAR GAIN CONTROL FACTOR OF THE AT LEAST TWO GAIN CONTROL FACTORS IS ADJUSTED BASED ON AT LEAST ONE FREQUENCY DEPENDENT MEASURE OF THE INPUT SIGNAL AND/OR A SIGNAL DERIVED THEREFROM, ONE OR MORE OF THE FREQUENCY DEPENDENT MEASURE(S) BEING UNIQUE FOR THE CORRESPONDING PARTICULAR GAIN CONTROL FACTOR

S2: CREATING AN OUTPUT SIGNAL COMPRISING THE HARMONIC COMPONENTS ACCORDING TO THE BALANCES AS CONTROLLED BY THE AT LEAST TWO GAIN CONTROL FACTORS

*Fig. 3*

GENERATING HARMONICS IN AN AUDIO SYSTEM

CROSS-REFERENCE TO RELATED APPLICATIONS

This application is the U.S. national phase of International Application No. PCT/SE2018/051190 filed Nov. 16, 2018 which designated the U.S., the entire contents of which is hereby incorporated by reference.

TECHNICAL FIELD

The proposed technology generally relates to audio processing, and more particularly to a method and system for generating harmonics, a system for generating a virtual bass signal, also referred to as a psycho-acoustic bass sensation signal, an audio processing system as well as a corresponding overall audio system and a computer program and computer-program product.

BACKGROUND

In general, there are several constraints involved when designing loudspeakers, which might affect the sound quality. The price point has always been important for a large range of applications. Today, size has also become more important than ever before. Small portable devices put very fundamental limits on the permissible size of the speakers. Battery life also matters in many applications.

Both the size and cost usually affect the bass performance the most. Low-frequency-drivers for loudspeakers are expensive because they need to have large magnets and a large physical size. Playing bass is also less efficient than playing higher frequencies, because of non-linear effects of the human ear.

At the same time, a lot of the music being produced at this time needs speakers that can play low frequencies well. A sound system capable of reproducing 50 Hz is commonly a necessity for accurately playback of any type of music and 30 Hz is not uncommon in modern electronic music.

If a loudspeaker cannot accurately reproduce the entire frequency range that is necessary for the audio signal being played, a large part of its content will be lost. Most music is a mix of many instruments, spanning different frequency regions and the amount of which these instruments are mixed has been critically adjusted in the production process, in order to make a song sound exciting and well-thought out. While the lyrics and melody are not very affected by a lack of bass, there are many aspects that can be. If there is an important bass line that is playing alone at some points, the listener will only perceive silence. Balances between different instrument groups or frequency regions will also be severely affected. If e.g. a song has a soft intro, which is followed by a loud part with lots of bass to make the music sound dramatic, the effect will be lost if said bass cannot be reproduced.

It is however possible to electrically modify the signal to the speaker to partially cope with these issues. Tone-controls or equalizers can be used to some extent to make the bass louder, but there are two major drawbacks with this approach:

Loudspeakers are not linear at low frequencies. This means that artificially high amplitudes, that are caused by equalization, will cause the loudspeaker to behave in a way that is hard to predict. The loudspeaker membrane will need to move excessively. There is a limit for how much the membrane can move without causing severe distortion or breaking the loudspeaker.

However, if it can be motivated to implement a DSP (Digital Signal Processor) into the product, or such already exists because some other functionality is also required, then there are some ways of improving the bass performance without mentioned drawbacks.

This solution is known as Virtual Bass, Virtual Bass Enhancement or Psycho-Acoustic Bass Enhancement. The key concept works as follows:

1. Define a frequency above which it is beneficial to play frequencies, and below which all frequencies need some help to be reproduced.
2. Extract said lower frequency range by the use of a low pass (or band pass) filter.
3. Generate harmonics from the output of said filter.
4. Add the harmonics back to the input signal, or a version of the input signal where the lower frequencies have been removed by the use of a high pass filter.

There should now be harmonics in the output of the loudspeaker, which can be reproduced by the speaker and are audible to a human listener. According to the so-called missing fundamental phenomenon, the pitch of the fundamental from which the harmonics are generated can then be perceived if the listener hears two or more consecutive harmonics of the fundamental frequency. This allows the listener to hear lower pitches than the speaker can reproduce.

SUMMARY

It is a general object to provide new and improved developments with respect to the process of generating harmonics in an audio system.

It is a specific object to provide a method for generating harmonics.

It is another object to provide a system for generating harmonics.

It is also an object to provide a system for generating a virtual bass signal, also referred to as a psycho-acoustic bass sensation signal.

Yet another object is to provide an audio processing system.

Still another object is to provide a corresponding overall audio system.

It is also an object to provide a computer program and computer-program product.

These and other objects are met by embodiments of the proposed technology.

According to a first aspect there is provided a method for generating harmonics from an input signal having an input frequency by using a harmonics generator having an associated gain controller for generating adjustable gain control factors for controlling the amplitude of harmonic components. The method comprises generating a series of harmonic components in a process comprising adjustment of relative balances between at least three harmonic components of different orders, the balances being independently adjustable by controlling at least two gain control factors. Each particular gain control factor of the at least two gain control factors is adjusted based on at least one frequency dependent measure of the input signal and/or a signal derived therefrom, one or more of the at least one frequency dependent measure of the input signal and/or a signal derived therefrom being unique for the corresponding particular gain control factor. The method further comprises creating an output signal comprising the harmonic components according to the balances as controlled by the at least two gain control factors, wherein the balances between the at least three harmonic components depend on the input frequency.

According to a second aspect there is provided a system for generating harmonics from an input signal having an input frequency. The system comprises a harmonics generator having an associated gain controller configured to generate adjustable gain control factors for controlling the amplitude of harmonic components. The harmonics generator is configured to generate a series of harmonic components based on adjustment of relative balances between at least three harmonic components of different orders. The gain controller is configured to determine at least two gain control factors for adjustment of these balances, wherein each particular gain control factor of the at least two gain control factors is adjusted based on at least one frequency dependent measure of the input signal and/or a signal derived therefrom, one or more of the at least one frequency dependent measure of the input signal and/or a signal derived therefrom being unique for the corresponding particular gain control factor.

According to a third aspect there is provided a system for generating a virtual bass signal, also referred to as a psycho-acoustic bass sensation signal, wherein the system for generating a virtual bass signal comprises a system for generating harmonics according to the second aspect.

According to a fourth aspect there is provided an audio processing system comprising a system for generating harmonics according to the third aspect.

According to a fifth aspect there is provided an audio system comprising an audio processing system according to the fourth aspect.

According to a sixth aspect there is provided a computer program for controlling, when executed by a processor, amplitudes of harmonics generated by a harmonics generator from an input signal having a fundamental frequency. The computer program comprises instructions, which when executed by the processor, cause the processor to determine at least two gain control factors for adjustment of relative balances between at least three harmonic components of different orders in a series of harmonic components. Each gain control factor is determined based on at least one frequency dependent measure of the input signal and/or a signal derived therefrom, and at least one of the frequency dependent measure(s) associated with one gain control factor is not the same for all input frequencies as the corresponding frequency dependent measure(s) associated with any other of said at least two gain control factors.

According to a seventh aspect there is provided a computer-program product comprising a computer-readable medium having stored thereon such a computer program.

According to an eighth aspect, there is provided an apparatus configured to perform the method as described herein.

In this way, it is possible to provide new and improved ways of generating harmonics in an audio system.

Other advantages will be appreciated when reading the following detailed description of non-limiting embodiment of the invention.

BRIEF DESCRIPTION OF DRAWINGS

The embodiments, together with further objects and advantages thereof, may best be understood by making reference to the following description taken together with the accompanying drawings, in which:

FIG. 2A is a schematic diagram illustrating an example of a system for generating harmonics according to an embodiment.

FIG. 2B is a schematic diagram illustrating another example of a system for generating harmonics according to an embodiment.

FIG. 3 is a schematic flow diagram illustrating an example of a method for generating harmonics according to an embodiment.

DETAILED DESCRIPTION

Throughout the drawings, the same reference designations are used for similar or corresponding elements.

Figure 1:
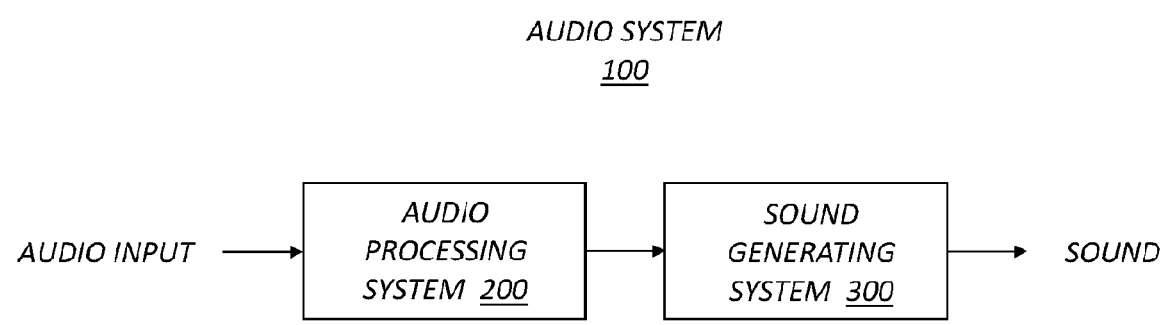
FIG. 1 is a schematic block diagram illustrating a simplified example of an audio system.

It may be useful to start with an audio system overview with reference to FIG. 1, which illustrates a simplified audio system. The audio system 100 basically comprises an audio processing system 200 and a sound generating system 300. In general, the audio processing system 200 is configured to process one or more audio input signals which may relate to one or more audio channels. The filtered audio signals are forwarded to the sound generating system 300 for producing sound.

As mentioned, for proper sound reproduction in some audio systems, the generation of harmonics form an input signal having a fundamental frequency is highly important.

FIG. 2A and FIG. 2B are schematic diagram illustrating examples of a system for generating harmonics from an input signal having a fundamental frequency according to an embodiment. Generally, the system 210 for generating harmonics comprises a harmonics generator 212 and an associated gain controller 214 for controlling the amplitudes of harmonic components.

FIG. 3 is a schematic flow diagram illustrating an example of a method for generating harmonics according to an embodiment. The method focuses on generating harmonics from an input signal having an input frequency by using a harmonics generator having an associated gain controller for generating adjustable gain control factors for controlling the amplitude of harmonic components.

Basically, the method comprises:

S1: generating a series of harmonic components in a process comprising adjustment of relative balances between at least three harmonic components of different orders, the balances being independently adjustable by controlling at least two gain control factors, wherein each particular gain control factor of the at least two gain control factors is adjusted based on at least one frequency dependent measure of the input signal and/or a signal derived therefrom, one or more of the at least one frequency dependent measure of the input signal and/or a signal derived therefrom being unique for the corresponding particular gain control factor.

S2: creating an output signal comprising the harmonic components according to the balances as controlled by the at least two gain control factors, wherein the balances between the at least three harmonic components depend on the input frequency.

Apart from the gain control factors mentioned in this, there may be embodiments where additional gain factors are used for purposes that are not in conflict with the presented innovation, such as overall gain adjustments that do not affect the balances between the generated harmonics.

The number of adjustable gain factors must be at least the same as the number of balances, which cannot be higher than one less than the number of harmonics generated in total. Two adjustable balances is the minimum number necessary to characterize the method, but the number of balances that may be used in practice is not limited.

By way of example, for each particular gain control factor of the at least two gain control factors, at least one frequency dependent measure of the input signal and/or a signal derived therefrom may be approximately constant for a sinusoidal input signal of constant amplitude and frequency, but varies for at least some changes in the input frequency. The uniqueness of one or more of the at least one frequency dependent measure(s) may be characterized in that at least one of the frequency dependent measure(s) of the input signal and/or a signal derived therefrom associated with a particular gain control factor is not the same for all input frequencies as the corresponding frequency dependent measure(s) of the input signal and/or a signal derived therefrom associated with any other of the at least two gain control factors.

For example, if the input is a sinusoid having a fundamental frequency, for each particular gain control factor of the at least two gain control factors, the at least one frequency dependent measure of the input signal and/or a signal derived therefrom may include at least one measure of the input signal and/or a signal derived therefrom being dependent on the fundamental frequency, and the input frequency is the fundamental frequency.

In a particular example, if the input is a sinusoid having a given fundamental frequency $f_0$ in a fundamental frequency region $f_f/i \leq f_0 \leq f_f$ such that $i>3$ and $f_f$ is in a dominant harmonics frequency region $f_h \leq f_f \leq 2 \cdot f_h$, at least three consecutive harmonics are generated at frequencies $n \cdot f_0$, $(n+1) \cdot f_0$, $(n+2) \cdot f_0$ for some integer $n \geq 1$, such that if $f_0 \leq f_h$, at least one of the three consecutive harmonics are within the dominant harmonics frequency region and if furthermore $f_0 \leq 2/3 \cdot f_h$, at least two of the three consecutive harmonics are within the dominant harmonics frequency region, and the balances between the three consecutive harmonics are adjustable by adjusting the at least two gain control factors.

For example, the at least two gain control factors may be adjusted so that either one harmonic component within the dominant harmonics frequency region has the highest amplitude among all harmonics of order greater than 1 in the output signal, or two harmonic components within the dominant harmonics frequency region has the same highest amplitude among all harmonics of order greater than 1 in the output signal, such that both of the two harmonics have the same amplitude and no other harmonic component of order greater than 1 has an amplitude higher than or equal to the amplitude of the two harmonic components.

In particular, the amplitudes of at least three harmonics of the lowest order larger than the highest order of the one or two harmonic with the highest amplitude may be either zero or monotonically decreasing with respect to an increased harmonic order. As an example, referring to the order of the component with the highest order of the one or two highest amplitude harmonic components as order k, the difference in amplitude between components at $k \cdot f_0$ and $(k+1) \cdot f_0$, and $(k+1) \cdot f_0$ and $(k+2) \cdot f_0$, and $(k+2) \cdot f_0$ and $(k+3) \cdot f_0$ may be constant or increasing, as $f_0$ is increasing.

As mentioned, the proposed technology may for example be applied to virtual bass emulation, where the harmonics are generated to provide a virtual bass signal or a psychoacoustic bass sensation signal.

In a particular example, each particular gain control factor of the at least two gain control factors adjusts the amplitude of an intermediate signal associated with the particular gain control factor, wherein the output signal will depend on the adjusted amplitude of the intermediate signal in the sense that if the input is sinusoidal having a fundamental frequency, the generated series of harmonic components may be represented as a sum of terms, where each of the terms comprises one or more harmonic components, with one term allowed to not depend on any of the particular gain control factors, and the remaining terms are proportional to at least one of the particular gain control factors. The intermediate signal may be characterized in that it comprises a series of harmonics components that is not necessarily the same as the output signal, and the output signal has been generated, directly or indirectly, based on at least the intermediate signal.

In another optional embodiment, the at least two gain control factors are at least partially determined based on intermediate signals in the harmonics generator, each one of the intermediate signals comprising one or more harmonic components of the input frequency. The intermediate signal may be characterized in that it comprises a series of harmonics components that is not necessarily the same as the total output signal, and the output series of harmonics components has been generated, directly or indirectly, based on at least the intermediate signal.

For example, the gain controller may comprise a number of gain computers, and each of the at least two gain control factors may be determined by a separate gain computer, wherein each particular gain computer of said gain computers determines a gain control factor based on at least one intermediate signal uniquely associated with said particular gain computer, wherein said unique association is characterized in that no other of said particular gain computers determines a gain control factor based on the at least one intermediate signal uniquely associated with said particular gain computer, creating a decentralized gain control system for the harmonic series.

It should be understood that the gain computers may have shared information.

In a particular example, the at least two gain control factors may be determined, such that, according to a sequential indexing of the at least two control factors, each particular gain control factor of the at least two control factors except for the first particular gain control factor, directly or indirectly, based on at least the previous particular gain control factor according to the sequential indexing.

For example, the harmonics may be generated by a circuit comprising at least m≥3 modules, wherein each of the modules has at least a module input and a fundamental input and provides at least a module output, and wherein the modules are connected sequentially, such that the module input of a first module takes the input signal or a signal derived therefrom, the module input of all other modules takes the module output of the previous module as its module input, and the fundamental input of each module takes the input signal or a signal derived therefrom, and the module output of the last module is used to create the output signal. Preferably, each particular module performs a harmonic order incrementor step, increasing the harmonic order of the module input by the harmonic order of the fundamental input to generate an enhanced signal, a gain control step, wherein the amplitude of the enhanced signal is adjusted by a, for the particular module, uniquely chosen gain control factor of the two or more gain control factors to generate a controlled enhanced signal, and an optional addition step, wherein the fundamental signal or a signal derived therefrom is optionally added to the controlled enhanced signal to create a module output signal comprising said controlled enhanced signal.

By way of example, the gain control factors are arranged so that for a sinusoidal input signal of a fundamental frequency, and for some integer p≥2, p gain control factors can be indexed as 1, 2, . . . , p such that the total gain of the harmonic component in the output at frequency $(q+1) \cdot f_0$ for every integer $1 \leq q \leq p$, is proportional to all of the $1^{st}$ to q:th gain control factor, where $f_0$ is the fundamental frequency.

In a particular example, the gain control factors are arranged so that for a sinusoidal input signal of a fundamental frequency, and for some integer p≥2, p gain control factors can be indexed as 1, 2, . . . , p such that the total gain of the harmonic component in the output at $(q+1) \cdot f_0$ for every integer $1 \leq q \leq p$ can be represented as a sum, wherein each term is proportional to exactly one of the q first gain control factors, where $f_0$ is the fundamental frequency.

Optionally, the gain control factors may furthermore be used for at least one of the following:
  compensating for gain errors caused by the generation of harmonics itself, such that the relation between the input amplitude and output amplitude is controlled;
  creating an intentional dynamic range compression or expansion of the harmonic series, as compared to the input amplitude;
  controlling the amplitude of the harmonics according to a psychoacoustic model, so that the perceived loudness of the total harmonic series follows the perceived loudness of the input signal; and
  adjusting the overall amplitude of the harmonic series.

In a particular example, the harmonics generator is part of a framework for enhancing a virtual bass signal, and the method further comprises the steps of:
  extracting at least one band of low frequencies from the main input signal(s) or signal(s) derived therefrom;
  applying a harmonics generator to at least one of the bands or signals derived therefrom; and
  combining the generated harmonic series from each band or signals derived therefrom and combining the result or signals derived therefrom with the original input or a signal derived therefrom.

In another example, if the input signal in itself is a series of harmonic components having a fundamental frequency, for each particular gain control factor of the at least two gain control factors, the at least one frequency dependent measure of the input signal and/or a signal derived therefrom may include at least one measure of the input signal and/or a signal derived therefrom being dependent on the fundamental frequency, and the input frequency is the fundamental frequency.

With reference once again to FIG. 2A and FIG. 2B, a corresponding system for generating harmonics will now be described.

FIG. 2A is a schematic diagram illustrating an example of a system for generating harmonics from an input signal having an input frequency according to an embodiment. The system 210 for generating harmonics comprises a harmonics generator 212 and an associated gain controller 214 configured to generate adjustable gain control factors for controlling the amplitude of harmonic components.

According to the proposed technology, the harmonics generator 212 is configured to generate a series of harmonic components based on adjustment of relative balances between at least three harmonic components of different orders, and the gain controller 214 is configured to determine at least two gain control factors for adjustment of the balances. In this example, each particular gain control factor of the at least two gain control factors is adjusted based on at least one frequency dependent measure of the input signal and/or a signal derived therefrom, wherein one or more of the at least one frequency dependent measure of the input signal and/or a signal derived therefrom is unique for the corresponding particular gain control factor.

By way of example, the harmonics generator 212 may further be configured to generate an output signal comprising the harmonic components according to the balances as controlled by the at least two gain control factors so that the balances between the at least three harmonic components depend on the input frequency.

As an example, for each particular gain control factor of the at least two gain control factors, the at least one frequency dependent measure of the input signal and/or a signal derived therefrom is approximately constant for a sinusoidal input signal of constant amplitude and frequency, but varies for at least some changes in the input frequency. Further, the uniqueness of one or more of the at least one frequency dependent measure may be characterized in that at least one of the frequency dependent measure(s) of the input signal and/or a signal derived therefrom associated with a particular gain control factor is not the same for all input frequencies as the corresponding frequency dependent measure(s) of the input signal and/or a signal derived therefrom associated with any other of the at least two gain control factors.

In a particular example, the gain controller 214 may be configured to determine the at least two gain control factors such that they affect the balances in different ways, and the gain control factors are dependent on changes in the input frequency, yielding changes in the balances for changes of the input frequency, thereby creating a series of harmonics that adapts to the input signal in a unique manner.

For example, the harmonics generator 212 is configured to allow each of the at least two gain control factors to adjust an amplitude of an intermediate signal in the harmonics generator, the intermediate signal comprising one or more harmonic components of the input frequency.

FIG. 2B is a schematic diagram illustrating another example of a system for generating harmonics according to an embodiment. In this example, the harmonics generator 212 and the gain controller 214 are integrated to enable the determination of the gain control factors to be nested with the generation of the harmonics.

As mentioned, the proposed technology may be used for generating a virtual bass signal, also referred to as a psycho-acoustic bass sensation signal. In particular, there is provided a system 100; 200 for generating a virtual bass signal, also referred to as a psycho-acoustic bass sensation signal, wherein the system 100; 200 for generating a virtual bass signal comprises a system 210 for generating harmonics.

In a particular example, there is provided an audio processing system 200 comprising a system 210 for generating harmonics. Furthermore, there is provided an overall audio system 100 comprising such an audio processing system 200.

For a better understanding, the invention will now be described with reference to additional, non-limiting examples.

The following text will use a mathematical language to describe an exact behaviour of embodiments of the proposed technology under ideal conditions. Some terminology needs to be introduced. From Fourier theory, it is known that any periodic signal (with physically reasonable properties) can be written as:

$$y(t) = \sum_{i=0}^{\infty} A_i \cos(2\pi i f_0 t + \varphi_i)$$

In this representation, the following terms can be used to describe its parts:

i is the order of a harmonic. A harmonic of order i has a frequency of $if_0$ and is referred to as the i:th harmonic.

$A_i$ is the amplitude of the i:th harmonic $f_0$ is the fundamental frequency.

$if_0$ is the frequency of the i:th harmonic.

$\varphi_i$ is the phase of the i:th harmonic. It is of little interest in this text, and is only mentioned for completeness.

$A_i \cos(2\pi i f_0 t + \varphi_i)$ is a harmonic component. A harmonic component always has an associated fundamental frequency $f_0$, which should be clear from its context wherever the term is used. The term harmonic component may refer to the time-domain signal above. Throughout this text, the phase may be ignored, so that two harmonic components that only differs in their phase are considered to be the same. The term harmonic may refer to a particular set $\{A_i, i, \varphi_i\}$. Throughout this text, the phase may be ignored, so that two harmonics that only differs in their phase are considered to be the same.

The combination of some or all $A_i$ is called a harmonic series. Two harmonic series are considered identical if all of the gains $A_i$ are the same, even if the fundamental frequencies of said two harmonic series are different. A harmonic series may optionally also have an associated fundamental frequency, but two harmonic series with different fundamentals may still be said to be the same.

The total signal itself, y(t) is a series of harmonic components. The information given in a series of harmonic components is the same as the information of a harmonic series with an associated fundamental frequency. The difference between a series of harmonic components and a harmonic series is that a series of harmonic components is a time-domain signal, while a harmonic series is a set of information about the amplitudes and phases of harmonics of different order.

The quotient $$\frac{A_i}{A_j}$$

for some i≈j is refered to as the balance between the i:th and j:th harmonic or harmonic component.

Figure 13:
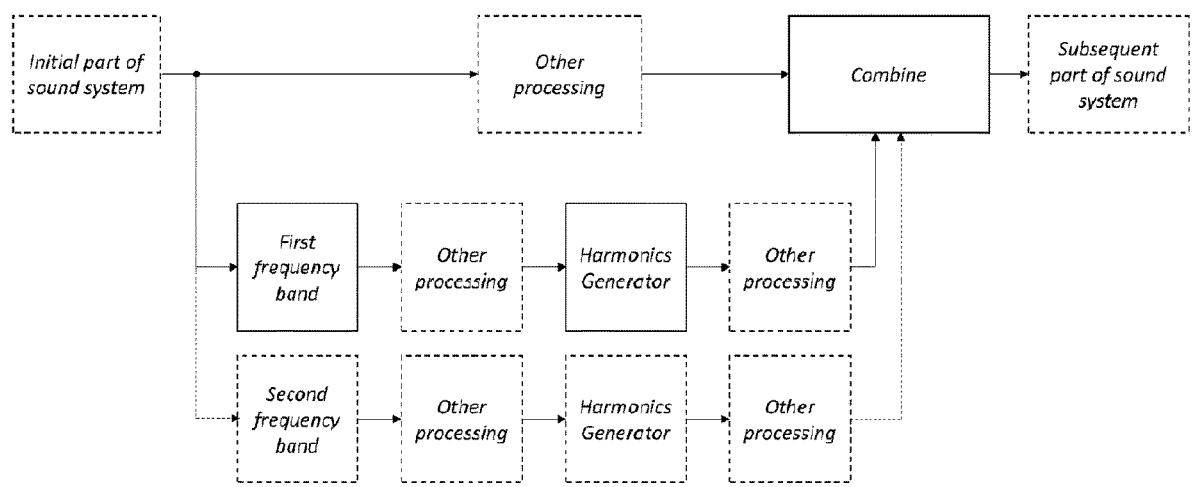
FIG. 13 is a schematic diagram illustrating an example of a framework in which the harmonics generator of any of the proposed embodiments can be used.

While the presented innovation concerns a method for generating harmonics, it will in many cases be found that the presented innovation is most suitable to be used as part of a framework for bass enhancement. FIG. 13 is a schematic diagram illustrating an example of such a framework. The non-optional blocks include first a block for selecting a frequency range of interest, where there are fundamental components from which it is desirable to generate harmonics. Typically this is implemented using a low pass filter or a band pass filter. The output of said block, containing a signal with limited bandwidth, is passed to the harmonics generator and the generated harmonics are re-combined with another signal, that comprises all the audible frequencies of the input signal. This will create an output signal comprising both unaltered high frequency components and harmonics generated from low frequency components, so that the listener can hear a signal related to both high and low frequency fundamentals. Some basic additions to the above framework are also possible, but not strictly necessary for the basic operation. More than one frequency band may be extracted in parallel to the first frequency band and passed to another harmonics generator before re-combining with the higher frequencies. Some additional processing may also be applied before or after the harmonics generators, such as compressors, filters etc to furthermore shape the signal. These can be placed both before/after the harmonics generator or both. Likewise, some additional processing may be applied to the upper branch of FIG. 13. This could be a high pass filter, removing frequency components of those frequencies from which harmonics are generated. A compressor could also be placed here. It should be noticed that many more options that do not affect the spirit of the harmonics generator itself are possible. We now leave this framework and move on do describing the harmonics generator, under the assumption that is placed into the minimal version of the described framework.

In the following, the proposed technology can be described using a terminology comprising two frequency regions: a harmonics region and a fundamental region. The fundamental region represents frequencies, from which it is desirable to generate harmonics. Typically, this can be associated with the frequency region below the resonance frequency of the loudspeaker, which corresponds to a frequency region where the acoustic output power is poor. The harmonics region represents a region where it is desirable to play harmonics, which are used to convey the illusion of a fundamental frequency in the fundamental range. Typically, this is specified as the frequency above the resonance frequency of the loudspeaker, which corresponds to a frequency region where the acoustic output power is adequate.

If harmonics are generated in the harmonics region, such that at least two consecutive harmonics are of audible amplitude, then the human ear can perceive the pitch of the fundamental frequency in the fundamental region, according to the missing fundamental phenomenon. Basically, this is the principle of operation for any invention of the prior art.

However, since the fundamental frequency is replaced by harmonics, it could therefore be expected that the new signal will not sound the same as the original and that the overall sound quality will suffer. The reason for this is that, even though the perceived pitch is the same, the timbre of the signal has been changed.

It has been noticed that it is important to take care to how the timbre is shaped, in order to generate a signal which does not only convey the correct pitch, but is also enjoyable for the listener. The best possible scenario would be to generate a harmonics series with the same timbre as the original signal, but this of course means that the generated harmonics would need to be the same as the input signal, which means that no harmonics are generated at all. However, this illustrates that it is desirable to make the timbre of the generated harmonics as similar to the timbre of the input as possible. An important aspect of this is that low order harmonics are more desirable than high order harmonics. Too low order harmonics are however not desirable either, since they do not contribute much to the overall acoustic output of the loudspeaker. It can therefore be said that the generated harmonics should be of as low order as possible, but of order high enough to keep them in the harmonics region.

In other words, it is desirable to limit the width of the harmonics region, so that it has an upper and a lower limit frequency. The fundamental region should still however be very wide, since this is a matter of the input signal, which cannot be controlled by the playback system. As an example, a speaker can have poor output below 200 Hz, while there may be music signals with important fundamentals at 25 Hz. This means that it may be desirable to generate harmonics from a fundamental frequency which can vary by a factor 8, or more, in frequency. If the fundamental is above 200 Hz, the fundamental frequency itself can be reproduced, so any additional harmonics will not contribute to the pitch perception very much, while they do affect the timbre in an undesirable way. However, as the fundamental frequency is lowered, it will become necessary to generate a second harmonic. In the very simplified world, where a frequency is either reproduced or not, it could then be said that harmonics at 398 Hz and 597 Hz are necessary if the fundamental frequency is lowered to 199 Hz. In this simplified world, it is then apparent that at least one harmonic needs to be within the range 200-400 Hz. And the harmonic within this range should have the highest amplitude out of all generated harmonics, so that the timbre of the signal is shifted towards lower frequencies. For a 50 Hz fundamental however, harmonics at 200 and 250 Hz are sufficient.

With this in mind, the concept of a dominant harmonics region is now proposed. This is the frequency region, where it is desirable to find the harmonic of the highest amplitude, referred to as the dominant harmonic, for any fundamental frequency within the fundamental region. And it follows from the above reasoning that the dominant harmonics region cannot be less than an octave wide; its lower and upper limit frequency must differ by at least a factor 2. Because otherwise, there will be a fundamental frequency just below the lower limit of the dominant harmonics region, which has its next harmonic at twice the fundamental frequency, which means that no harmonic of the fundamental will be found in the dominant harmonics region. The number of harmonics within the dominant harmonics region will be at least one. As the fundamental frequency is furthermore lowered so that it is less than a third of the upper limit of the dominant harmonics region, it will also follow that there are at least two harmonics within the dominant harmonics region. This pattern can also be extended for lower order fundamentals.

The above does however also serve a great opportunity, which can be utilized in an embodiment of the presented invention, because it indicates that is sufficient for the dominant harmonic region to be a factor 2 wide for any fundamental frequency in the fundamental frequency region.

In many applications, it can however be found that the desirable fundamental region is wider than one octave, and therefore wider than the best possible harmonics region. This implies a limitation: There is no fixed harmonics series (e.g. 0.25*second harmonic, 0.75*third harmonic . . . ), which has its dominant harmonic in the harmonics region for any fundamental frequency in the fundamental region.

The prior art has presented some solutions which can be seen as partial solutions to this problem. By way of example, U.S. Pat. No. 7,551,742 presents a solution which uses multiple band pass filters to generate a multitude of frequency bands within the fundamental region, so that (if ideal filters were possible to implement) only one band contains the fundamental component. Harmonics can then be generated from every band individually. Since the band pass filters only pass through frequencies in a narrow band, the problem is transformed into several problems, wherein the fundamental region is narrow. Hence it is possible to generate harmonics according to a fixed harmonics series for every band, so that the dominant harmonics are always placed in the harmonics region. Solutions like this does however depend heavily of the response of the band pass filters, and in practice, the steep filters that are generally desirable result in time-domain errors such as pre-ringings (linear phase filters) or post-ringings (minimum phase filters). Furthermore, this does not give full control over how the harmonics are generated within the harmonics region, unless a very high number of bands are used. This does however give poor results both in terms of computational costs and sound quality.

Another prior art solution is to generate all possible harmonics of interest, and then sort out those that are desirable by using a band-pass filter on the output side of the harmonics generator, e.g. as disclosed in Chinese patent application CN101964190. While this will indeed make sure that the dominant harmonics are always kept in the harmonics region, it has three shortcomings.

First, generation of many harmonics at the same time is not an easy task. This becomes apparent if considering that a signal containing all harmonics of equal amplitude must have peaks with infinitely high amplitudes. Such signal cannot exist, and it is typically found that any method of generating harmonics will have decaying amplitudes for orders sufficiently high.

Secondly, the ideal bandwidth of the harmonics series may depend on the fundamental frequency. The missing fundamental phenomenon states that two harmonics are necessary to convey the illusion of a fundamental frequency. However, it has also been observed that a harmonics series where many harmonics have strong amplitudes is very sensitive to changes in the input signal. It may also show bad time-domain behavior, such as a very high crest factor, which corresponds to inefficient use of available power. So a bandwidth that is suitable for a high fundamental frequency, will give a harmonics series comprising many harmonics of strong amplitude when the fundamental is low, since the frequency difference between the harmonics is small. And similarly, a bandwidth that is suitable for a low frequency fundamental will only let one harmonic have a high amplitude when the fundamental frequency is high.

Thirdly, bandpass filtering does not solve the issue of intermodulation distortion. This is the frequency components which appear when generating harmonics from a signal comprising more than one sinusoid, and thus can be said to have multiple fundamental frequencies. Intermodulation components are those that appear at frequencies that are not integer multiples of a fundamental frequency and thereby also sound unnatural to the human ear. It can be especially problematic when generating high order harmonics, since the number of intermodulation components grow at least quadratically, as the number of harmonics increases linearly. Intermodulation components may also appear on frequencies which are very close to the harmonics that are generated and are desirable to keep. This prevents them from being removable by filtering, as it would also affect the desirable components too.

The presented invention removes these issues, and provides a harmonics series with all the desired properties for any fundamental frequency. It can be noticed that methods described in prior art may be able to reach similar results for some particular design frequencies, similar to how malfunctioning clock still shows the correct time once every 12 hours. But just as the clock needs to move to be able to show the correct time all of the day, it can be argued that a harmonics generator needs to adapt its behaviour according to the input signal, in order to generate the best possible harmonics series for any input signal.

Below follows a description of some non-limiting example embodiments of the presented invention, which should clarify how this may be achieved.

Figure 4:
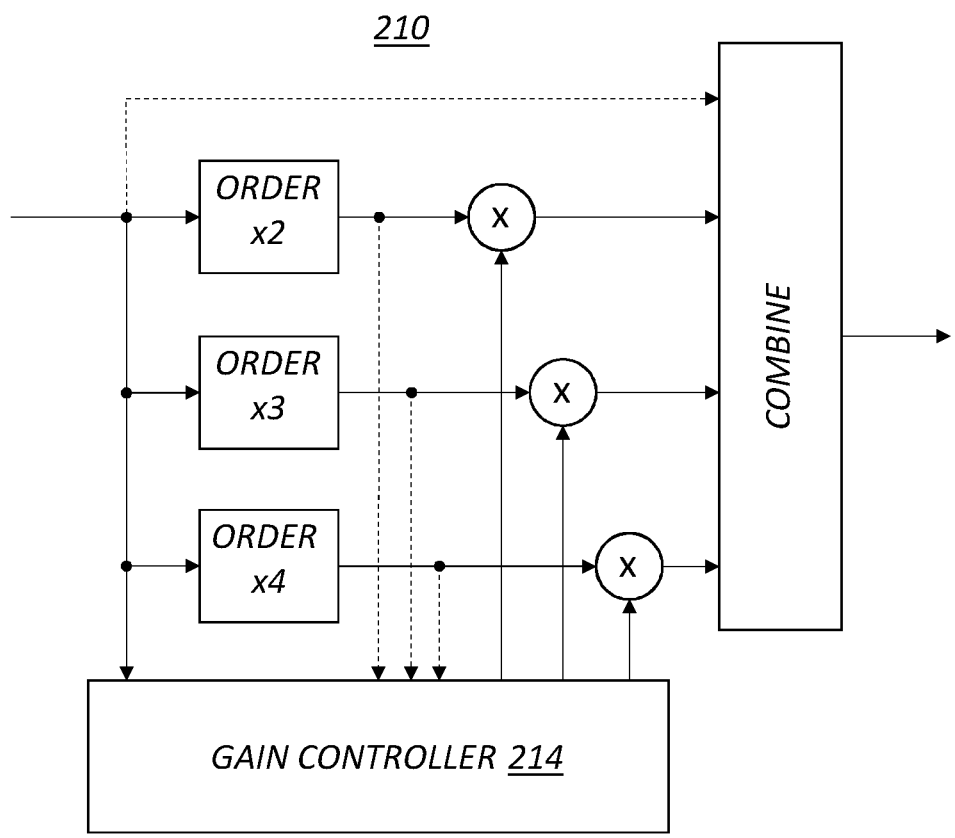
FIG. 4 is a schematic diagram illustrating a simple example of how multiple gain factors may be used to control the shape of the generated harmonics series.

FIG. 4 provides a simple example of how multiple gain factors may be used to control the shape of the generated harmonics series. The entire figure is herein referred to as the harmonics generator, while the blocks generating the actual harmonics are referred to as partial harmonics generators, in order to distinguish them from the total circuit, which is referred to as a harmonics generator. In this embodiment, the partial harmonics generators are implemented as harmonic order multipliers. From an input signal which is assumed to be a single sinusoid of a particular frequency, there is harmonic order multiplier for generating harmonics of 2×the fundamental frequency, one for generating harmonics of 3×the fundamental frequency and one for generating harmonics at 4×the fundamental frequency. It should be understood that the number of harmonic order multipliers and the highest order harmonic that can be generated, may vary in practice. All examples to follow use 4× as the highest harmonics generated, since it should be sufficient for illustrating the concepts. This yields three harmonics in the output, which differ from the input signal, so even if the fundamental component is not included in the output, this is sufficient to enable adjustment of two balances between three harmonics. In some embodiments, the harmonic order multipliers may not generated pure harmonics. There may be lower order harmonics terms in the output of every partial harmonics generator as well, as will be shown in later analysis. For each generated harmonic, there is an adjustable gain control factor, which allows balances to be adjusted. After the individual balances are adjusted, the harmonics are combined to create a harmonics series comprising harmonics according to balances set by the adjustable gain control factors.

In this embodiment, the gains are adjusted by a centralized gain controller 214, which at least analyzes the input of the harmonics generator. It provides three gain control signals, used to adjust the gain of the harmonics, and thereby the balances between the harmonics.

This circuit provides the necessary elements for controlling the gain of the harmonics based on the actual input signal, so that the harmonics series generated may be adjusted depending on the fundamental frequency.

The embodiment of FIG. 4 provides the possibility of also including the fundamental itself in the combined output signal. One reason why this could be desirable is that the fundamental frequency may be so high that it is within the range where it is desirable to have dominant harmonics. In any way, it does not affect the spirit of the innovation.

The embodiment of FIG. 4 also provides the possibility to generate the control signals not only based on the input signal, but also based on the intermediate signals found at the output of the harmonic order multipliers. This can improve the performance, since the gain control signals take into account any artefacts that may be introduced by the partial harmonics generators. In practice, it is often found difficult to generate pure harmonics of a fundamental. And when the input is not a pure sinusoid, some artefacts will also be generated. So by adjusting the gain based on the actual generated harmonics, performance is improved. The function of the embodiment of FIG. 4 can be further explained by analyzing it mathematically:

One way of implementing the harmonic order multipliers of FIG. 4 is by self-multiplication of the input signal, that is:

$$y_2 = x^2$$

$$y_3 = x^3$$

$$y_4 = x^4$$

where $y_2$, $y_3$ and $y_4$ represent the output of the partial harmonics generators generating harmonics at 2×, 3× and 4× the fundamental frequency respectively.

Assuming that the input signal can be written as a sinusoid with some amplitude and frequency as:

$$x = A \cos(f_0)$$

the output of the different harmonics order multipliers may be written as:

$$y_2 = \frac{A^2}{2} + \frac{A^2}{2}\cos(2f_0)$$

$$y_3 = \frac{3A^3}{4}\cos(f_0) + \frac{A^3}{4}\cos(3f_0)$$

$$y_4 = \frac{3A^4}{8} + \frac{4A^4}{8}\cos(2f_0) + \frac{A^4}{8}\cos(4f_0)$$

While it is true that the highest frequency component of y4 is 4× the fundamental frequency, it can herein be seen that there are also components at lower frequencies. These can be reduced by also including high pass filters into the harmonic order multipliers. If the cut-off frequency of these high pass filters are set as the lower end of the dominant harmonics region, the lower order components will be attenuated when they are below the lower end of the dominant harmonics region. However, these high pass filters make analysis of the system more complicated, so the consequences of implementing them will only be described when necessary. Furthermore, linear filters do not affect the frequencies, nor how the output amplitude depends on the input amplitude A. Therefore, the control laws can be adequately described without taking filters into account.

The combined output, where the gain factors $g_1$, $g_2$ and $g_3$ are also included to adjust the amplitude of the intermediate signals $y_1$, $y_2$ and $y_3$, can then be written as the sum:

$$y_{total} = x + g_1 y_2 + g_2 y_3 + g_3 y_4 == x + g_1 x^2 + g_2 x^3 + g_3 x^4 ==$$
$$g_1 \frac{A^2}{2} + g_3 \frac{A^4}{2} ++ \left(A + g_2 \frac{3A^3}{4}\right) \cos(f_0) ++ \left(g_1 \frac{A^2}{2} + g_3 \frac{3A^4}{8}\right)$$
$$\cos(2f_0) ++ g_2 \frac{A^3}{4} \cos(3f_0) ++ g_3 \frac{A^4}{8} \cos(4f_0)$$

This sum represents the combined output as a sum of as many terms as there are harmonics, but where amplitudes of any harmonic in the output, and therefore also the relative balances between harmonics, depend on many of the gains. This must be accounted for. There is also a strong dependence on the input amplitude, which can be removed by estimating the amplitude of the input, and then re-writing the gain control signals to:

$$g_1 = \frac{1}{A} g_1'$$
$$g_2 = \frac{1}{A^2} g_2'$$
$$g_3 = \frac{1}{A^3} g_3'$$

This will make so that all terms in the sum above, which describes the output, are proportional to the input amplitude A, and the new gains $g_1'$ $g_2'$ and $g_3'$ may be designed so that they only are affected by the fundamental frequency of the input and not its amplitude. Other control laws, where the gains are allowed to furthermore have some dependence on the amplitude of the input as well as the frequency, are also possible for this circuit. This embodiment still simplifies calculation of the gain control signals in comparison to other embodiments, since every term of the output signal depends on only exactly one gain control factor. In this embodiment, the harmonic at a particular frequency in the output can be written as a sum of several terms, wherein every term only depends on one or none of the gain factors. In mathematical language, this means that the output signal depends affinely on the set of gain factors, and if there furthermore is no term that is independent on all gain factors, the output depends linearly on the set of gain factors. Embodiments where this does not hold will be shown later.

In the above embodiment description, two assumptions were made. First, it was assumed that the input could be represented as a sinusoid. While this might not be the case in practice, it is a possibility, for which the result should be as described above. It is however very important to highlight that the input signal is generally not under control in most applications. For more complicated cases, an exact analysis is generally not possible. It can however be said that if the input is similar to a sinusoid, the output should be similar to the concept illustrated above. The following text will also assume a sinusoidal input unless otherwise noticed, since this allows an accurate description of the embodiments, without loss of generality.

Secondly, since the gains are computed online and are allowed to change, they will add some more harmonics components in the output. While these components may be measurable, they will not affect the representation of the output as a sum that depends on the different gains as variables. And the effects of the gains on the measurable amplitudes and balances between different harmonics components should not be affected by these variable gains to a large extent. For a stationary input signal, such as a sinusoid, the gain control factors should ideally stay approximately constant.

Figure 5:
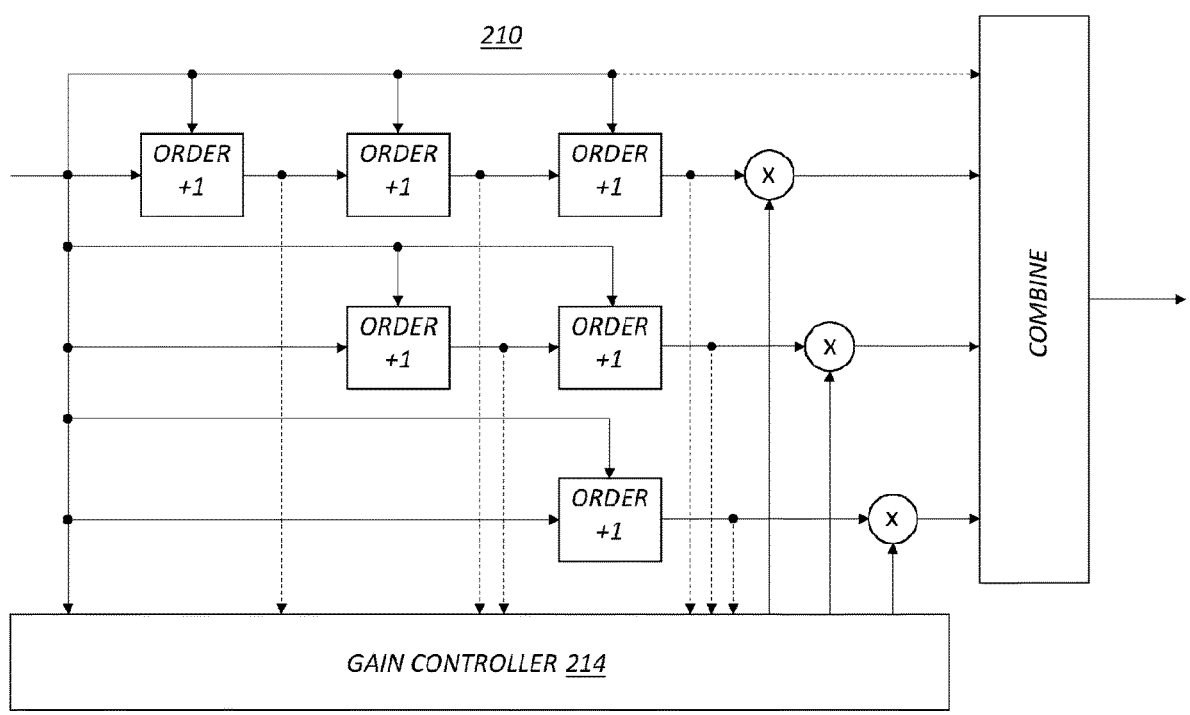
FIG. 5 is a schematic diagram illustrating another example of how multiple gain factors may be used to control the shape of the generated harmonics series, similar to the embodiment of FIG. 4.

FIG. 5 shows an embodiment similar to FIG. 4. The main difference is that instead of generating the harmonics in one step using an harmonics order multiplier, the harmonics generation is done in multiple steps, each step increasing the order of the harmonics series by 1. Each such block can be referred to as a harmonic order incrementor and can be implemented as a multiplication of its two input signals, which then would give a circuit with exactly the same behaviour as in FIG. 4. The difference is that the circuit of this embodiment can generate the gain control signals based on intermediate signals not having the full harmonic order of the output. If a high pass filter is included in the harmonics order increment blocks to remove unwanted low frequency components, then these signals will provide new useful information that can be utilized for the gain signal generation, and can improve the results in comparison to the realization of FIG. 4.

Figure 6:
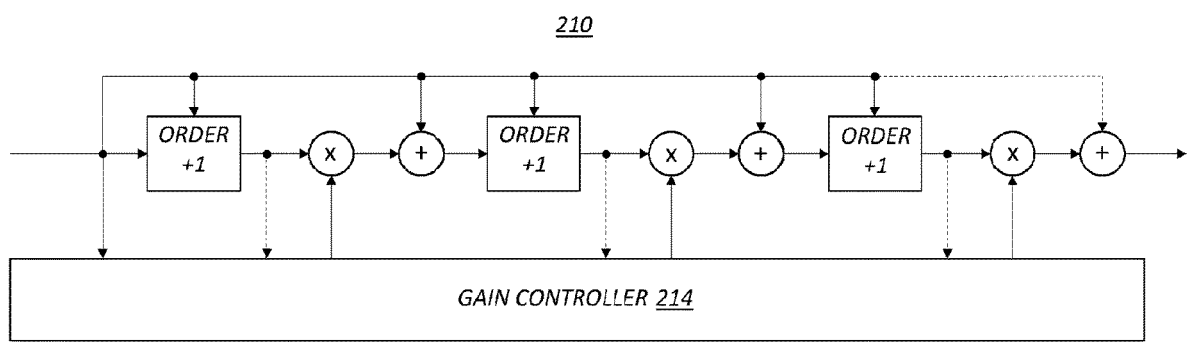
FIG. 6 is a schematic diagram illustrating yet another example of how multiple gain factors may be used to control the shape of the generated harmonics series, which may be seen as a special case of the embodiment of FIG. 5.

FIG. 6 shows yet another embodiment, which can be viewed as a special case of FIG. 5, wherein the three harmonic order incrementors in the third column of harmonic order incrementors has been summed into one incrementor, and similar for the second column. It can be said that the harmonics are generated cumulatively, by letting a cumulatively enhanced signal pass through a series of harmonic order incrementors and adders. This circuit allows generation and control of harmonics just as the embodiment of FIG. 4 as will be shown.

If all of the harmonics order incrementors are realized as multipliers and the three gain factors are written as $k_1$, $k_2$ and $k_3$, then the output can be written as:

$$y = x(1 + k_1 x(1 + k_2 x(1 + k_3 x)))$$

or $$y_{total} = x + k_1 x^2 + k_1 k_2 x^3 + k_1 k_2 k_3 x^4 =$$
$$k_1 \left(\frac{A^2}{2} + k_2 k_3 \frac{A^4}{2}\right) ++ \left(A + k_1 k_2 \frac{3A^3}{4}\right) \cos(f_0) ++ k_1 \left(\frac{A^2}{2} + k_2 k_3 \frac{3A^4}{8}\right)$$
$$\cos(2f_0) ++ k_1 k_2 \frac{A^3}{4} \cos(3f_0) ++ k_1 k_2 k_3 \frac{A^4}{8} \cos(4f_0)$$

Now, the gain controller 214 is of course free to choose the three gains in any way. If in particular, this is done as:

$$k_1 = g_1$$
$$k_2 = \frac{g_2}{g_1}$$
$$k_3 = \frac{g_3}{g_2}$$

then the output of FIG. 6 will be the same as that of FIGS. 4 and 5. The main difference between this embodiment and that of FIG. 4 is that the available information which the gain controller 214 may choose to utilize differs and that the gain control must be implemented in a different way. The reason for this is that, as can be seen, the total harmonic component at $(n+1)f_0$, $n=1,2,3\ldots$ is proportional to n gain factors, as opposed to the embodiment of FIGS. 4 and 5. Hence, the output does not depend affinely or linearly on the set of gain factors, since some terms depends on more than one gain factor. The circuit of FIG. 6 can be seen as a repeated pattern of modules, wherein each module comprises a harmonic order incrementor, a gain control factor and an adder.

Figure 7:
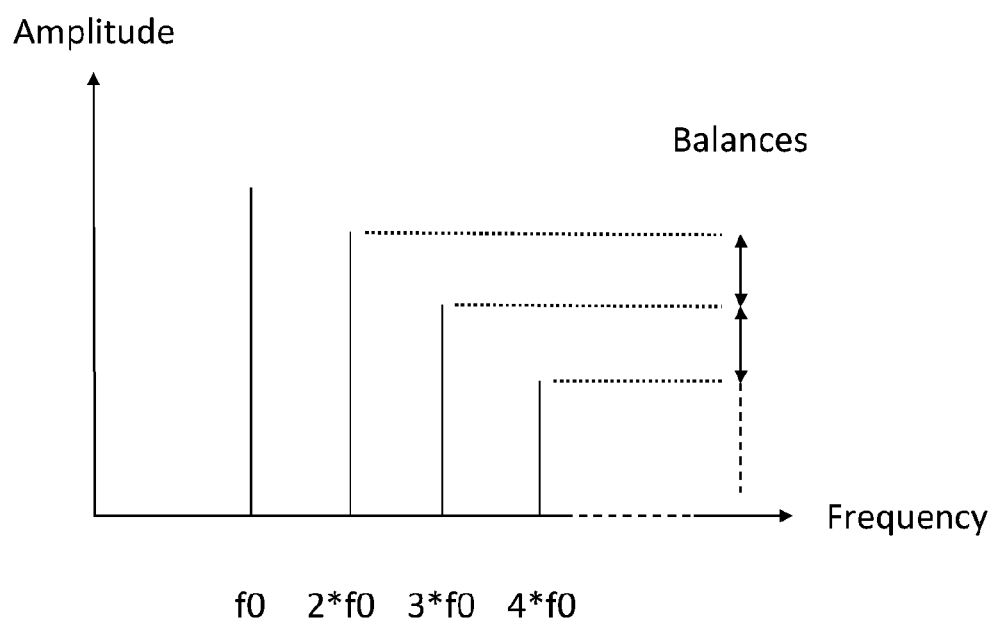
FIG. 7 is a schematic diagram illustrating a typical example of the balances between harmonics.

FIG. 7 is a schematic diagram illustrating an example of the balances between harmonics. The fundamental frequency is shown as $f_0$ and the next three harmonics are shown. The balances, which is the difference in amplitude between two consecutive harmonics, are also illustrated. The harmonics series may proceed with higher order harmonics than what is shown in the figure. Generally, the number of balances that may be adjusted is one less than the number of harmonics in the output of the harmonics generators. It cannot be the same number, because the maximum number of free variables for adjustment cannot be higher than the number of harmonics, and one of these free variables must correspond to adjustment of the overall amplitude, which is not a balance. It is however possible for the number of adjustable balances to be any number lower than the order of the highest harmonic that is generated. This is because it will always be possible to create a circuit that essentially can give the herein described behaviour, but has some additional circuits or imperfections, causing higher order harmonics to be generated without being controllable.

Figure 8:
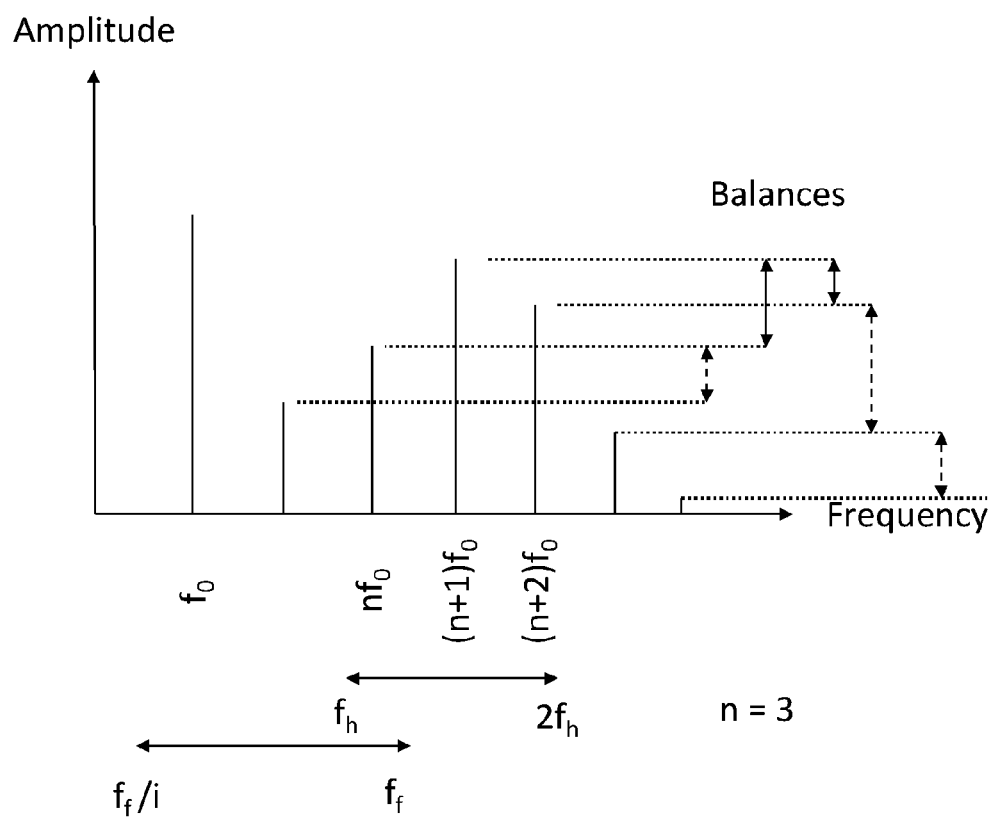
FIG. 8 is a schematic diagram illustrating an example of how the balances between the harmonics may be adjusted for a particular fundamental frequency.
Figure 9:
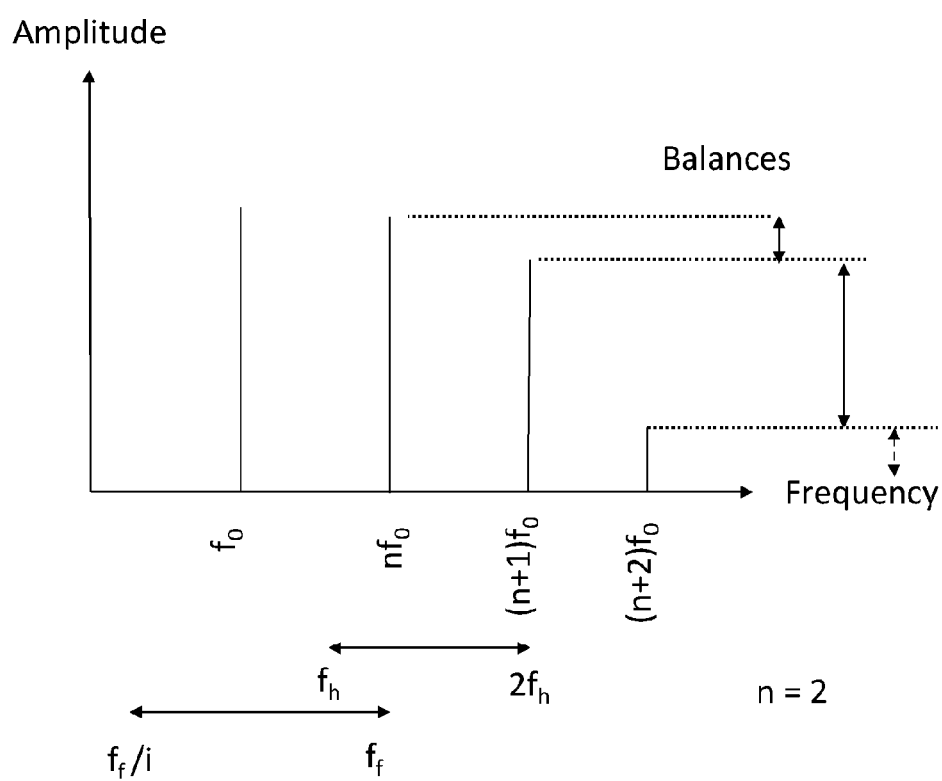
FIG. 9 is a schematic diagram illustrating another example of how the balances between the harmonics may be adjusted for a particular fundamental frequency higher than the fundamental frequency of FIG. 8.
Figure 10:
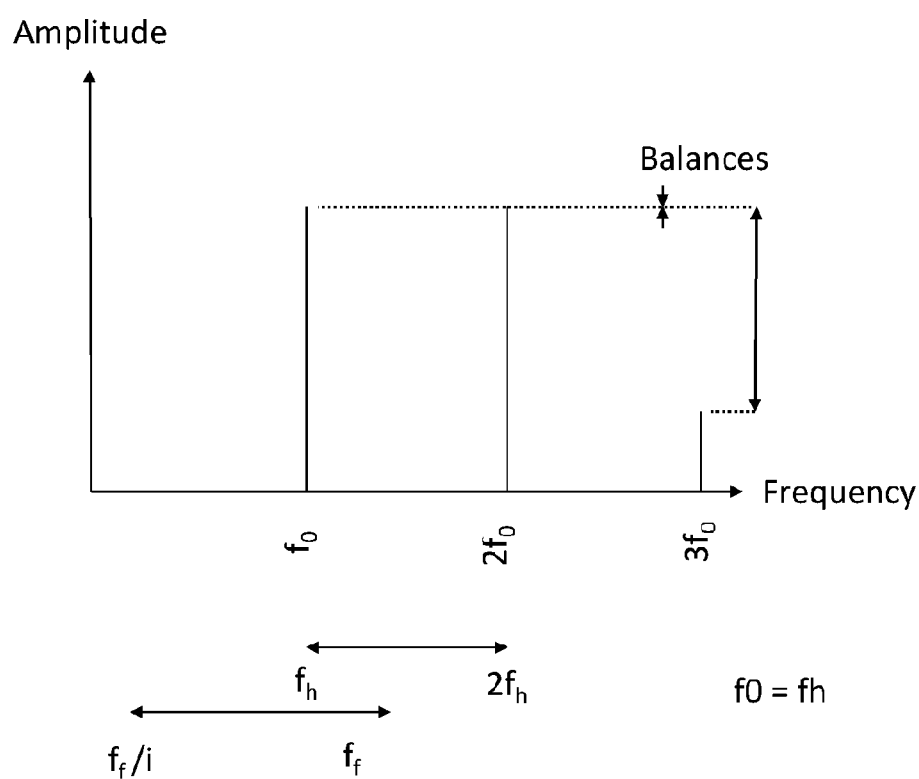
FIG. 10 is a schematic diagram illustrating yet another example of how the balances between the harmonics may be adjusted for one specific frequency.

FIGS. 8 and 9 illustrate how the balances between the harmonics may be adjusted for two different fundamental frequencies. The goal is to place the dominant part of the harmonics series in a particular frequency range, for any given fundamental frequency. In FIG. 8, the harmonic at 4× the input frequency has the highest amplitude, while the harmonics of both higher and lower order have lower amplitudes, the further away they are from the $4^{th}$ harmonic. In FIG. 10 however, the fundamental frequency is higher than that of FIG. 9. In this case, it is necessary to keep the amplitude of the harmonic at 2× the fundamental frequency the highest. If the harmonic at 4× the fundamental frequency would have the highest amplitude, the generated harmonics series would have been dominated by harmonics at too high frequencies, since the fundamental frequency is high in this case.

We now acknowledge that the input fundamental frequency must be able to change by any small amount. It is also desirable that very small changes of the fundamental frequency should yield very small changes in the output signal. On the large scale however, it is noticed that the dominant harmonic will have different order for different fundamentals. From these observations, it can be concluded that as the fundamental frequency shifts between a frequency where the nth harmonic is the desirable dominant harmonic, towards a frequency where the n+1th harmonic is the desirable dominant harmonic, there must be a frequency in-between for which both of these harmonics have the same amplitude. It can also be concluded that it is desirable to have a unique harmonics series for every fundamental frequency, such that there are no two fundamental frequencies yielding exactly the same harmonics series.

If in particular the desired dominant harmonic order n is 1, then there will be an octave difference to the next harmonic. The exact frequency where both of these are then of the same amplitude can then be used to define the harmonics region in a way that is both measurable and exact. Previously, it was described as if the harmonics region would be a parameter set by the user. That would however not give a very well-defined result in terms of how the harmonics are generated. This new proposed definition does however correspond to what is generated in practice. For some embodiments, the matching between a user adjustable parameter and the generated signal may not be perfect. Furthermore, as the fundamental frequency shifts downwards, higher and higher order dominant harmonics are necessary. Each transition between such orders must see a frequency where there are two dominant harmonics having the same amplitude.

Just as it is desirable that the dominant harmonic has different orders for different fundamental frequencies, it could also be desirable that harmonics of an order that differs a lot from the order of the dominant harmonic, should have a much lower amplitude than harmonics of order similar to that of the dominant harmonic. This can improve sound quality, since it limits the amplitude of harmonics at high frequencies. One way of achieving this, is to make the difference between harmonics of different orders approach a loss of x dB for every increase in the harmonic order, as the order of harmonics become high. Another option is to make the amplitude of the harmonics the same, as if the signal would have been processed by a low pass filter, which may also depend on the fundamental frequency. Any of these options will, in combination with what previously has been said, give a harmonics series, whose frequency domain representation resembles a bell curve, with a peak close to the dominant harmonic. If looking at the harmonics above the dominant harmonic, it will be found that the next harmonic will have an amplitude lower than the dominant harmonic. The next harmonic after that will be even lower in amplitude and so on. In other words, the amplitude of the harmonics above the dominant harmonic are monotonically decreasing with respect to an increased harmonic order. Moreover, when slightly increasing the fundamental frequency, the amplitude of all harmonics above the dominant harmonic should be decreased. Furthermore, the difference in amplitude between them should also remain constant or increase. Otherwise, the difference would be decreasing when increasing the fundamental frequency, which is not compatible with said bell curve. Enforcing this bell curve behaviour is however most important for harmonics of higher order than the order of the dominant harmonic. Harmonics of lower order should not be high in amplitude, since attempting to play them consumes unnecessary power in the sound system. But since they are not very audible, it is not important to control their amplitude with great accuracy. Therefore, high pass filters may be inserted into a multitude of positions of the given embodiments to remove these components, without affecting the amplitudes of the harmonics that are necessary to provide an output signal with the desired properties.

The gain controller can be implemented in a multitude of ways in order to achieve the behaviour of the harmonics that has been described above. The most trivial method would be to only adjust the harmonics based on the input signal alone, generating each control signal as an independent function that depends on the frequency, or more generally the frequency distribution, of the input signal. This does however have the drawback that the control laws are determined based on a control scheme that needs to be aware of what the output signal from the partial harmonics generators are. In the case that the input is a pure sinusoid, this can easily be predicted. But as previously mentioned, the input is rarely a pure sinusoid, so the harmonics that are generated in practice may not so easily be predicted due to error terms. A better option is to have the gain controller make its decisions based upon the actual harmonics which are generated. Both feedback and feedforward topologies can be used for this behaviour. All embodiments described herein show feedforward methods, since they are easier to analyze mathematically, and are preferable in digital implementations. The key concept is that the gain controller adjusts the gains based on the signals that are to be controlled. While the outputs of the partial harmonics generators can be seen as signals derived from the input, and thereby do not provide any information that is not available in the input itself, they can provide the essential aspects of this information that are important for adjusting the gain factors. This gives the gain controller 214 good control over the amplitude of all the harmonics that are generated in all of the embodiments of FIGS. 4, 5 and 6. In the case of FIG. 6, there is one gain factor which can affect the amplitude of all harmonics of different orders. In FIGS. 4, 5 and 12, the amplitude of the sum of all harmonics can be adjusted by adjusting all of the gain control factors simultaneously. While this does not necessarily reflect all possible control laws that may be used in practice, it shows that the gain controller 214 has full control over the part of the output signal that is not the fundamental component itself. The embodiments of FIGS. 6 and 11 can also give the same result by adjusting one of the gain factors or all of the gain factors respectively.

It should be clear that by adjustment of the gain factors, the behaviour that has been described as desirable, can be achieved by use of any of the embodiments presented. Each of the gain control units of the gain controller needs to provide different gain signals for different fundamental frequencies. It can also be noticed that the frequency at which the gain for a particular harmonic needs to be the highest, is different for different order harmonics. Therefore, there the desired behaviour cannot be achieved without a gain control system where every gain control signal does not depend on the input in its own way. It is not possible to first derive one frequency dependent gain control signal and then derive all of the other gain control signals from it, without taking the frequency of the fundamental into further account, implicitly or explicitly. The necessary adjustments of the harmonics series can only be performed if each gain control factor depends on the fundamental frequency in a unique way.

There is however one simplification that can be done for the computation of the gain control signals. We start by looking at the embodiment of FIG. 4 and remember that the goal of the generation of harmonics is to keep the order of the dominant harmonic as low as possible, but of order high enough to keep its frequency within the harmonics region.

By some simplification, this can be reformulated into a law that is applied as a condition for every single harmonic, instead of being a law that applies to the harmonics series as a whole. This individual law states that a harmonic of order n should only be dominant if A) the harmonic at order n is above the lower limit of the harmonics region and B) none of the harmonics of order (n−1) is. To adjust the gains according to this simplified law, it can then be said that the gain of the nth harmonic only needs to depend on the generated nth harmonic and the generated (n−1)th harmonic. Then the gain controller of FIG. 4 can be split into as many gain control units as there are gain signals, and letting each gain control unit operate using only a subset of all the available intermediate signals.

This motivates using a de-centralized control system, where no gain control unit has full knowledge of all information in the system. This can simplify the design of the gain controller.

Figure 11:
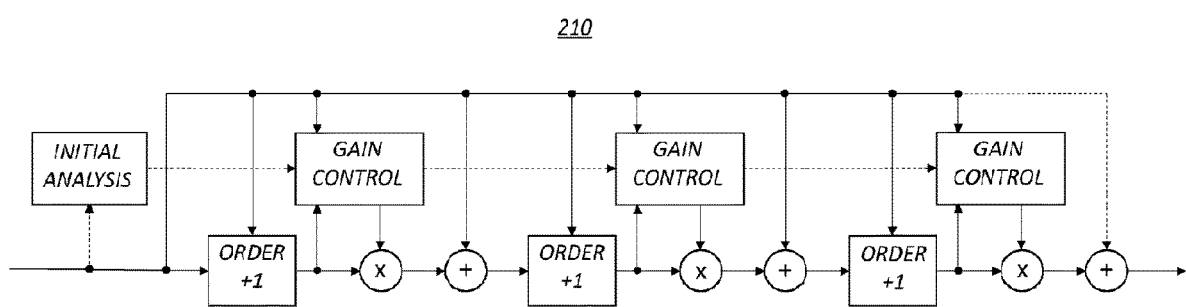
FIG. 11 is a schematic diagram illustrating an example equivalent to FIG. 6, but with a decentralized control system.
Figure 12:
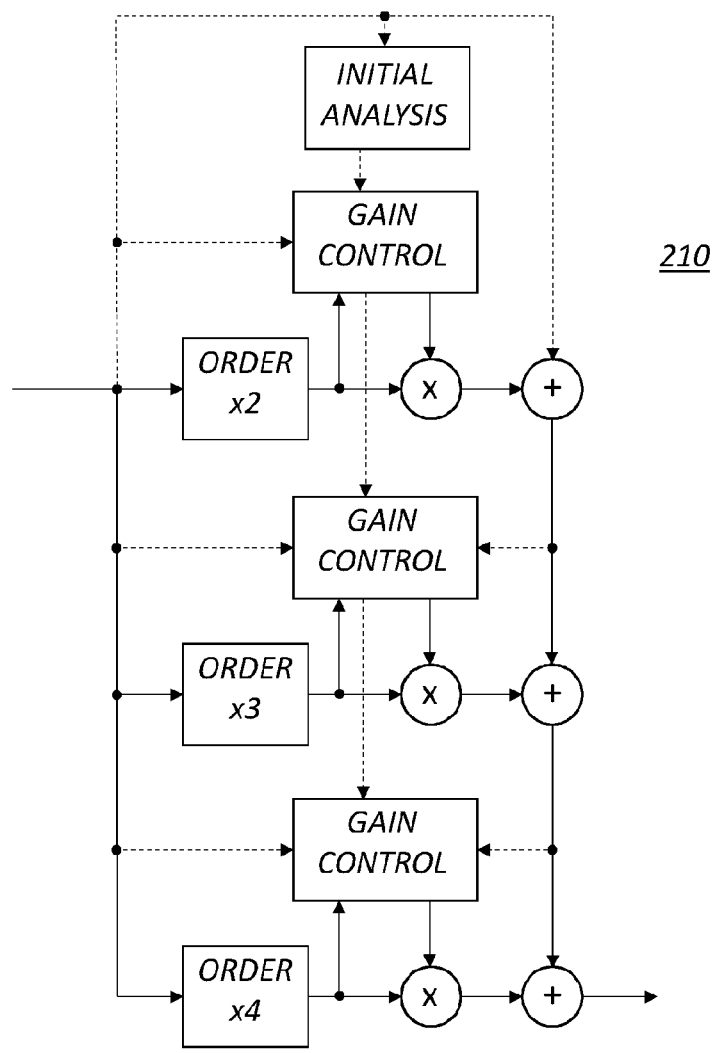
FIG. 12 is a schematic diagram illustrating an example equivalent to FIG. 4, but with a decentralized control system.

FIG. 11 is the equivalent to FIG. 6. The structure of the harmonic order incrementors is the same as that of FIG. 6, but the gain controller of FIG. 11 is split into one gain control unit for every harmonic that is to be controlled. This is referred to as a de-centralized control system, where no single gain control unit has information about every signal in the harmonics generator. In this decentralized control system, it is implied that the desirable gains can be computed by only analyzing the intermediate signal that is to be controlled and the fundamental component.

Yet one observation is that the gain control units of FIG. 11 can be seen as hierarchically arranged according to a sequential indexing corresponding the order in which they appear from left to right in FIG. 11. By this indexing, the first gain control unit determines a gain control factor based only on signals that are not affected by the other gain control factors in any way. However, all other gain control units determine a corresponding gain control factor based on signals that have been affected by all gain control units of lower index. By recursion, this is equivalent to stating that all other gain control units determines a corresponding gain control factor based on signals that have been affected by the previous gain control unit.

Similarly, FIG. 12 is the equivalent to FIG. 4, but with a decentralized control system.

Even though the decentralized control system can be sufficient for creating a set of gain signals with the desirable properties, there might be embodiments where all of the gain control units need the same computations based on the input to be made. This is of course a waste of processing resources, so it can be beneficial to do some initial analysis and share that data with the gain control units. It is also possible that information generated in one gain control unit is useful for the computations in the next gain control unit in the chain, so it should also be possible to pass on information between the gain control units.

It will be appreciated that the methods and arrangements described herein can be implemented, combined and re-arranged in a variety of ways.

By way of example, there is provided an apparatus configured to perform the method as described herein.

For example, embodiments may be implemented in hardware, or in software for execution by suitable processing circuitry, or a combination thereof.

For example, it should be understood that the term "gain computer" as used herein may refer to any circuitry adapted to perform the computation of a gain control factor as described herein. The term "gain computer" can sometimes be referred to as a "gain computation circuitry" or gain control unit". The same applies for the term "gain controller", which may refer to any overall circuitry adapted to generate gain control factors.

The steps, functions, procedures, modules and/or blocks described herein may be implemented in hardware using any conventional technology, such as discrete circuit or integrated circuit technology, including both general-purpose electronic circuitry and application-specific circuitry.

Alternatively, or as a complement, at least some of the steps, functions, procedures, modules and/or blocks described herein may be implemented in software such as a computer program for execution by suitable processing circuitry such as one or more processors or processing units.

Examples of processing circuitry includes, but is not limited to, one or more microprocessors, one or more Digital Signal Processors (DSPs), one or more Central Processing Units (CPUs), video acceleration hardware, and/or any suitable programmable logic circuitry such as one or more Field Programmable Gate Arrays (FPGAs), or one or more Programmable Logic Controllers (PLCs).

It should also be understood that it may be possible to re-use the general processing capabilities of any conventional device or unit in which the proposed technology is implemented. It may also be possible to re-use existing software, e.g. by reprogramming of the existing software or by adding new software components.

It is also possible to provide a solution based on a combination of hardware and software. The actual hardware-software partitioning can be decided by a system designer based on a number of factors including processing speed, cost of implementation and other requirements.

Figure 14:
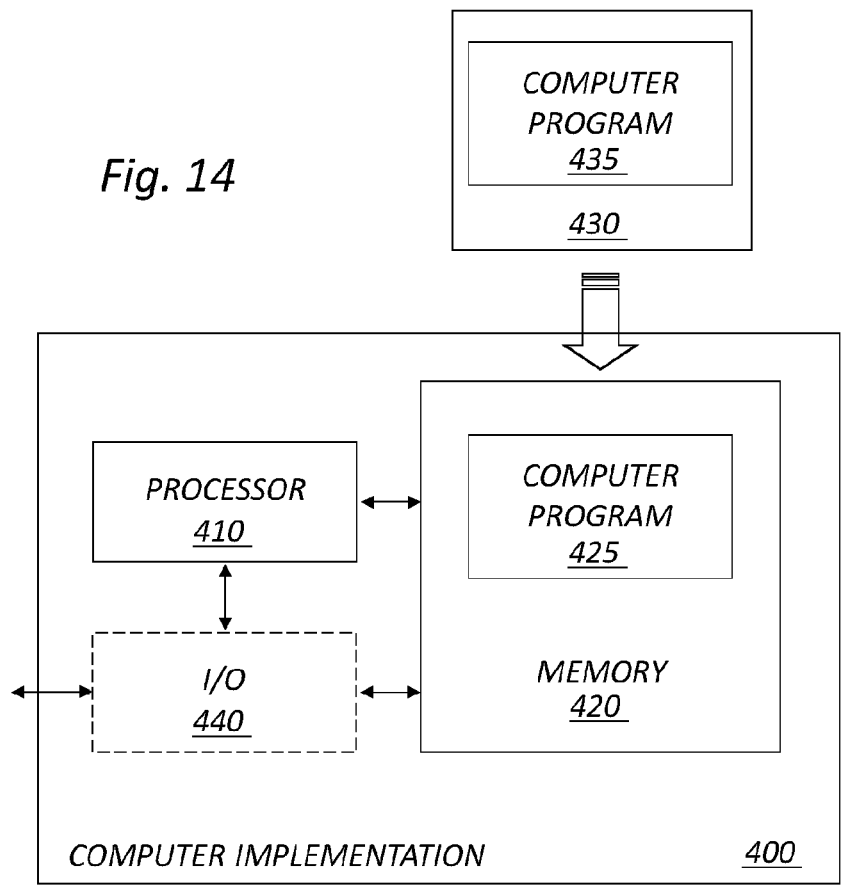
FIG. 14 is a schematic diagram illustrating an example of a computer-implementation according to an embodiment.

FIG. 14 is a schematic diagram illustrating an example of a computer-implementation according to an embodiment. In this particular example, at least some of the steps, functions, procedures, modules and/or blocks described herein are implemented in a computer program 425; 435, which is loaded into the memory 420 for execution by processing circuitry including one or more processors 410. The processor(s) 410 and memory 420 are interconnected to each other to enable normal software execution. An optional input/output device 440 may also be interconnected to the processor(s) 410 and/or the memory 420 to enable input and/or output of relevant data such as input parameter(s) and/or resulting output parameter(s).

The term 'processor' should be interpreted in a general sense as any system or device capable of executing program code or computer program instructions to perform a particular processing, determining or computing task.

The processing circuitry including one or more processors 410 is thus configured to perform, when executing the computer program 425, well-defined processing tasks such as those described herein.

The processing circuitry does not have to be dedicated to only execute the above-described steps, functions, procedure and/or blocks, but may also execute other tasks.

In a particular embodiment, the computer program 425; 435 comprises instructions, which when executed by the processor 410, cause the processor 410 to perform the tasks described herein.

More specifically, there is provided a computer program 425; 435 for controlling, when executed by a processor 410, amplitudes of harmonics generated by a harmonics generator from an input signal having a fundamental frequency. The computer program 425; 435 comprises instructions, which when executed by the processor 410, cause the processor 410 to determine at least two gain control factors for adjustment of relative balances between at least three harmonic components of different orders in a series of harmonic components. Each gain control factor is determined based on at least one frequency dependent measure of the input signal and/or a signal derived therefrom, and at least one of the frequency dependent measure(s) associated with one gain control factor is not the same for all input frequencies as the corresponding frequency dependent measure(s) associated with any other of the at least two gain control factors.

The proposed technology also provides a carrier comprising the computer program, wherein the carrier is one of an electronic signal, an optical signal, an electromagnetic signal, a magnetic signal, an electric signal, a radio signal, a microwave signal, or a computer-readable storage medium.

By way of example, the software or computer program 425; 435 may be realized as a computer program product, which is normally carried or stored on a non-transitory computer-readable medium 420; 430, in particular a non-volatile medium. The computer-readable medium may include one or more removable or non-removable memory devices including, but not limited to a Read-Only Memory (ROM), a Random Access Memory (RAM), a Compact Disc (CD), a Digital Versatile Disc (DVD), a Blu-ray disc, a Universal Serial Bus (USB) memory, a Hard Disk Drive (HDD) storage device, a flash memory, a magnetic tape, or any other conventional memory device. The computer program may thus be loaded into the operating memory of a computer or equivalent processing device for execution by the processing circuitry thereof.

The procedural flows presented herein may be regarded as a computer flows, when performed by one or more processors. A corresponding apparatus may be defined as a group of function modules, where each step performed by the processor corresponds to a function module. In this case, the function modules are implemented as a computer program running on the processor.

The computer program residing in memory may thus be organized as appropriate function modules configured to perform, when executed by the processor, at least part of the steps and/or tasks described herein.

Alternatively it is possible to realize the function modules predominantly by hardware modules, or alternatively by hardware, with suitable interconnections between relevant modules. Particular examples include one or more suitably configured digital signal processors and other known electronic circuits, e.g. discrete logic gates interconnected to perform a specialized function, and/or Application Specific Integrated Circuits (ASICs) as previously mentioned. Other examples of usable hardware include input/output (I/O) circuitry and/or circuitry for receiving and/or sending signals. The extent of software versus hardware is purely implementation selection.

The embodiments described above are merely given as examples, and it should be understood that the proposed technology is not limited thereto. It will be understood by those skilled in the art that various modifications, combinations and changes may be made to the embodiments without departing from the present scope as defined by the appended claims. In particular, different part solutions in the different embodiments can be combined in other configurations, where technically possible.

The invention claimed is:

1. A method for generating harmonics from an audio input signal having an input frequency by using a harmonics generator (212) having an associated gain controller (214)

for generating adjustable gain control factors for controlling the amplitude of harmonic components, wherein the method comprises:
- generating (S1) a series of harmonic components in a process comprising adjustment of relative balances between at least three harmonic components of different orders, said balances being independently adjustable by controlling at least two gain control factors,
- wherein each particular gain control factor of said at least two gain control factors is adjusted based on at least one frequency dependent measure of the input signal and/or a signal derived therefrom, one or more of said at least one frequency dependent measure of the input signal and/or a signal derived therefrom being unique for corresponding particular gain control factor, wherein an intermediate signal corresponds to a signal derived from the input signal,
- creating (S2) an output signal comprising said harmonic components according to said balances as controlled by said at least two gain control factors, wherein the balances between said at least three harmonic components depend on the input frequency,
- wherein said at least two gain control factors are at least partially determined based on the input signal and intermediate signals in the harmonics generator, each one of said intermediate signals comprising one or more harmonic components of the input frequency and said intermediate signal is furthermore characterized in that it comprises a series of harmonics components that is not necessarily the same as the output signal, and the output signal is generated, directly or indirectly, based on at least said intermediate signal(s).

2. The method of claim 1, wherein, for each particular gain control factor of said at least two gain control factors, said at least one frequency dependent measure of the input signal and/or a signal derived therefrom is approximately constant for a sinusoidal input signal of constant amplitude and frequency, but varies for at least some changes in the input frequency, and
- wherein the uniqueness of one or more of said at least one frequency dependent measure is characterized in that at least one of the frequency dependent measure(s) of the input signal and/or a signal derived therefrom associated with a particular gain control factor is not the same for all input frequencies as the corresponding frequency dependent measure(s) of the input signal and/or a signal derived therefrom associated with any other of said at least two gain control factors.

3. The method of claim 2, wherein if the input is a sinusoid having a fundamental frequency, for each particular gain control factor of said at least two gain control factors, said at least one frequency dependent measure of the input signal and/or a signal derived therefrom includes at least one measure of the input signal and/or a signal derived therefrom being dependent on said fundamental frequency, and said input frequency is said fundamental frequency.

4. The method of claim 3, wherein if the input is a sinusoid having a given fundamental frequency $f_0$ in a fundamental frequency region $f_f/i \leq f_0 \leq f_f$ such that $i>3$ and $f_f$ is in a dominant harmonics frequency region $f_h \leq f_f \leq 2 \cdot f_h$, at least three consecutive harmonics are generated at frequencies $n \cdot f_0$, $(n+1) \cdot f_0$, $(n+2) \cdot f_0$ for some integer $n \geq 1$, such that if $f_0 \leq f_h$, at least one of said three consecutive harmonics are within the dominant harmonics frequency region and if furthermore $f_0 \leq 2/3 \cdot f_h$, at least two of said three consecutive harmonics are within the dominant harmonics frequency region, and the balances between said three consecutive harmonics are adjustable by adjusting said at least two gain control factors.

5. The method of claim 4, wherein said at least two gain control factors are adjusted so that either one harmonic component within the dominant harmonics frequency region has the highest amplitude among all harmonics of order greater than 1 in the output signal, or two harmonic components within the dominant harmonics frequency region has the same highest amplitude among all harmonics of order greater than 1 in the output signal, such that both of said two harmonics have the same amplitude and no other harmonic component of order greater than 1 has an amplitude higher than or equal to the amplitude of said two harmonic components.

6. The method of claim 5, wherein the amplitudes of at least three harmonics of the lowest order larger than the highest order of said one or two harmonic with the highest amplitude is either zero or monotonically decreasing with respect to an increased harmonic order, and, when referring to the order of the component with the highest order of the one or two highest amplitude harmonic components as order k, the difference in amplitude between components at $k \cdot f_0$ and $(k+1) \cdot f_0$, and $(k+1) \cdot f_0$ and $(k+2) \cdot f_0$, and $(k+2) \cdot f_0$ and $(k+3) \cdot f_0$ is constant or increasing, as $f_0$ is increasing.

7. The method of claim 2, wherein if the input signal in itself is a series of harmonic components having a fundamental frequency, for each particular gain control factor of said at least two gain control factors, said at least one frequency dependent measure of the input signal and/or a signal derived therefrom includes at least one measure of the input signal and/or a signal derived therefrom being dependent on said fundamental frequency, and said input frequency is said fundamental frequency.

8. The method of any of claim 1, wherein the harmonics are generated to provide a virtual bass signal or a psychoacoustic bass sensation signal.

9. The method of claim 1, wherein each particular gain control factor of said at least two gain control factors adjusts the amplitude of an intermediate signal associated with said particular gain control factor, wherein the output signal will depend on the adjusted amplitude of said intermediate signal in the sense that if the input is sinusoidal having a fundamental frequency, the generated series of harmonic components may be represented as a sum of terms, where each of said terms comprises one or more harmonic components, with one term allowed to not depend on any of said particular gain control factors, and the remaining terms are proportional to at least one of said particular gain control factors.

10. The method of claim 9, wherein said gain controller comprises a number of gain computers, and each of said at least two gain control factors is determined by a separate gain computer, wherein each particular gain computer of said gain computers determines a gain control factor based on at least one intermediate signal uniquely associated with said particular gain computer, wherein said unique association is characterized in that no other of said particular gain computers determines a gain control factor based on the at least one intermediate signal uniquely associated with said particular gain computer, creating a decentralized gain control system for the harmonic series.

11. The method of claim 1, wherein said at least two gain control factors are determined, such that, according to a sequential indexing of said at least two control factors, each particular gain control factor of said at least two control factors except for the first particular gain control factor, is directly or indirectly, based on at least the previous particular gain control factor according to said sequential indexing.

12. The method of claim 11, wherein said gain controller has a number of gain control units, and wherein, by the sequential indexing, a first gain control unit determines a gain control factor based only on signals that are not affected by the other gain control factors, and all other gain control units determine a corresponding gain control factor based on signals that have been affected by all gain control units of lower index.

13. The method of claim 1, wherein the harmonics are generated by a circuit comprising at least m≥3 modules, wherein each of said modules has at least a module input and a fundamental input and provides at least a module output,
wherein the modules are connected sequentially, such that the module input of a first module takes the input signal or a signal derived therefrom, the module input of all other modules takes the module output of the previous module as its module input, and the fundamental input of each module takes the input signal or a signal derived therefrom, and the module output of the last module is used to create the output signal, and
wherein each particular module performs a harmonic order incrementor step, increasing the harmonic order of the module input by the harmonic order of the fundamental input to generate an enhanced signal, a gain control step, wherein the amplitude of said enhanced signal is adjusted by a, for the particular module, uniquely chosen gain control factor of said two or more gain control factors to generate a controlled enhanced signal.

14. The method of claim 1, wherein the gain control factors are arranged so that for a sinusoidal input signal of a fundamental frequency, and for some integer p≥2, p gain control factors can be indexed as 1, 2, . . . , p such that the total gain of the harmonic component in the output at frequency $(q+1) \cdot f_0$ for every integer 1≤q≤p, is proportional to all of the $1^{st}$ to q:th gain control factor, where $f_0$ is the fundamental frequency.

15. The method of claim 1, wherein the gain control factors are arranged so that for a sinusoidal input signal of a fundamental frequency, and for some integer p≥2, p gain control factors can be indexed as 1, 2, . . ., p such that the total gain of the harmonic component in the output at $(q+1) \cdot f_0$ for every integer 1≤q≤p can be represented as a sum, wherein each term is proportional to exactly one of the q first gain control factors, where $f_0$ is the fundamental frequency.

16. The method of claim 1, wherein said gain control factors are furthermore used for at least one of the following:
compensating for gain errors caused by the generation of harmonics itself, such that the relation between the input amplitude and output amplitude is controlled;
creating an intentional dynamic range compression or expansion of the harmonic series, as compared to the input amplitude;
controlling the amplitude of the harmonics according to a psychoacoustic model, so that the perceived loudness of the total harmonic series follows the perceived loudness of the input signal; and
adjusting the overall amplitude of the harmonic series.

17. The method of claim 1, wherein the harmonics generator is part of a framework for enhancing a virtual bass signal, and the method further comprises the steps of:
extracting at least one band of low frequencies from the main input signal(s) or signal(s) derived therefrom;
applying a harmonics generator to at least one of the bands or signals derived therefrom; and
combining the generated harmonic series from each band or signals derived therefrom and combining the result or signals derived therefrom with the original input or a signal derived therefrom.

18. A system (210) for generating harmonics from an audio input signal having an input frequency, wherein said system (210) comprises a harmonics generator (212) having an associated gain controller (214) configured to generate adjustable gain control factors for controlling the amplitude of harmonic components,
wherein said harmonics generator (212) is configured to generate a series of harmonic components based on adjustment of relative balances between at least three harmonic components of different orders, and
wherein said gain controller (214) is configured to determine at least two gain control factors for adjustment of said balances, wherein each particular gain control factor of said at least two gain control factors is adjusted based on at least one frequency dependent measure of the input signal and/or a signal derived therefrom, one or more of said at least one frequency dependent measure of the input signal and/or a signal derived therefrom being unique for the corresponding particular gain control factor, wherein an intermediate signal corresponds to a signal derived from the input signal,
wherein said harmonics generator (212) is configured to generate an output signal comprising said harmonic components according to said balances as controlled by said at least two gain control factors, wherein the balances between said at least three harmonic components depend on the input frequency, and
wherein said at least two gain control factors are at least partially determined based on the input signal and intermediate signals in the harmonics generator, each one of said intermediate signals comprising one or more harmonic components of the input frequency and said intermediate signal comprises a series of harmonics components that is not necessarily the same as the output signal, and the output signal is generated, directly or indirectly, based on at least said intermediate signal(s).

19. The system of claim 18, wherein, for each particular gain control factor of said at least two gain control factors, said at least one frequency dependent measure of the input signal and/or a signal derived therefrom is approximately constant for a sinusoidal input signal of constant amplitude and frequency, but varies for at least some changes in the input frequency, and
wherein the uniqueness of one or more of said at least one frequency dependent measure is characterized in that at least one of the frequency dependent measure(s) of the input signal and/or a signal derived therefrom associated with a particular gain control factor is not the same for all input frequencies as the corresponding frequency dependent measure(s) of the input signal and/or a signal derived therefrom associated with any other of said at least two gain control factors.

20. The system of claim 18, wherein said gain controller (214) is configured to determine said at least two gain control factors such that they affect said balances in different ways, and said gain control factors are dependent on changes in the input frequency, yielding changes in said balances for changes of the input frequency, thereby creating a series of harmonics that adapts to the input signal.

21. The system of claim 18, wherein said harmonics generator (212) is configured to allow each of said at least two gain control factors to adjust an amplitude of an intermediate signal in the harmonics generator, said intermediate signal comprising one or more harmonic components of the input frequency.

22. The system of claim 18, wherein the harmonics generator (212) and the gain controller (214) are integrated to enable the determination of the gain control factors to be nested with the generation of the harmonics.

23. A system (100; 200) for generating a virtual bass signal, also referred to as a psycho-acoustic bass sensation signal, wherein said system (100; 200) for generating a virtual bass signal comprises a system (210) for generating harmonics according to claim 18.

24. An audio processing system (200) comprising a system (210) for generating harmonics according to claim 18.

25. An audio system (100) comprising an audio processing system (200) of claim 23.

26. A non-transitory computer-readable medium on which is stored a computer program (425; 435) for controlling, when executed by a processor (410), amplitudes of harmonic components generated by a harmonics generator (212) from an audio input signal having an input frequency, wherein the computer program (425; 435) comprises instructions, which when executed by the processor (410), cause the processor (410) to determine at least two gain control factors for adjustment of relative balances between at least three harmonic components of different orders in a series of harmonic components, wherein each gain control factor is determined based on at least one frequency dependent measure of the input signal and/or a signal derived therefrom, wherein an intermediate signal corresponds to a signal derived from the input signal, wherein at least one of the frequency dependent measure(s) associated with one gain control factor is not the same for all input frequencies as the corresponding frequency dependent measure(s) associated with any other of said at least two gain control factors, wherein said at least two gain control factors are at least partially determined based on the input signal and intermediate signals in the harmonics generator, each one of said intermediate signals comprising one or more harmonic components of the input frequency and said intermediate signal is furthermore characterized in that it comprises a series of harmonics components that is not necessarily the same as the output signal.

27. An apparatus configured to perform the method according to claim 1.

\* \* \* \* \*